United States Patent
Ma et al.

(10) Patent No.: US 9,245,897 B2
(45) Date of Patent: Jan. 26, 2016

(54) FLASH MEMORY DEVICE AND RELATED MANUFACTURING METHOD

(71) Applicant: Semiconductor Manufacturing International (Shanghai) Corporation, Shanghai (CN)

(72) Inventors: Huilin Ma, Beijing (CN); Liqun Zhang, Beijing (CN); Hokmin Ho, Beijing (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/494,456

(22) Filed: Sep. 23, 2014

(65) Prior Publication Data

US 2015/0270273 A1    Sep. 24, 2015

(30) Foreign Application Priority Data

Mar. 19, 2014    (CN) .......................... 2014 1 0101129

(51) Int. Cl.
*H01L 21/336*    (2006.01)
*H01L 27/115*    (2006.01)

(52) U.S. Cl.
CPC ...... *H01L 27/11521* (2013.01); *H01L 27/1156* (2013.01); *H01L 27/11548* (2013.01)

(58) Field of Classification Search
CPC .................. H01L 27/11521; H01L 29/42328; H01L 21/28273; H01L 29/66825; H01L 29/7883; H01L 27/105
See application file for complete search history.

(56) References Cited

U.S. PATENT DOCUMENTS

| | | | |
|---|---|---|---|
| 6,339,015 B1 * | 1/2002 | Bracchitta | H01L 21/28273 257/E21.209 |
| 6,723,604 B2 * | 4/2004 | Yuan | H01L 27/115 257/E21.682 |

* cited by examiner

*Primary Examiner* — Jaehwan Oh
(74) *Attorney, Agent, or Firm* — Innovation Counsel LLP (57) ABSTRACT

A method for manufacturing a memory device may include obtaining a substrate structure that includes a substrate, an oxide material layer positioned on the substrate, a polysilicon material layer positioned on the oxide material layer, a first control gate and a second control gate positioned on the polysilicon material layer, and an offset oxide layer positioned between the first control gate and the second control gate. The method may further include the following steps: removing, using the offset oxide layer as a first mask, a portion of the polysilicon material layer for forming a polysilicon structure that includes a first step structure; forming a masking oxide layer on the offset oxide layer; removing, using the masking oxide layer as a second mask, a portion of the polysilicon structure for forming a floating gate polysilicon member that includes the first step structure and a second step structure.

13 Claims, 8 Drawing Sheets

110 Remove portions of control gate offset oxide layers of a semiconductor substrate 120 Remove portions of a floating gate polysilicon member at an erase gate region and at word line regions to form a first set of edges 130 Forming thin oxide layers on the control gate offset oxide layers and on the control gate sidewall layers that are positioned at the word line regions 140 Remove the thin oxide layers positioned at the word line regions 150 Remove portions of the floating gate polysilicon member and the floating gate oxide layer at the erase gate region and the word line regions to form floating gates 160 Remove the remaining thin oxide layers and the remaining control gate offset oxide layers 170 Form erase gate tunneling oxide layers and floating gate sidewall layers on control gate sidewall layers at different positions 180 Form silicon oxide layers in the erase gate region and the word line regions; provide polysilicon on the silicon oxide layers to form an erase gate and word lines

210 Sequentially form a floating gate oxide layer, a floating gate polysilicon member, a gate dielectric material layer, a control gate polysilicon material layer, a control gate silicon oxide material layer, and a control gate silicon nitride material layer on a substrate

↓

220 Etch (using a patterned photoresist as a mask) the control gate silicon nitride material layer, the control gate silicon oxide material layer, the control gate polysilicon material layer, and the gate dielectric material layer to form control gates, erase gate regions, and word line regions

↓

230 Remove the patterned photoresist, form two control gate sidewall layers on two opposite sides of each control gate, and form a control gate offset oxide layer on one of the two control gate sidewall layers that immediately neighbors the corresponding erase gate region

FIG. 11

FLASH MEMORY DEVICE AND RELATED MANUFACTURING METHOD

CROSS-REFERENCE TO RELATED APPLICATION

This application claims priority to and benefit of Chinese Patent Application No. 201410101129.1, filed on 19 Mar. 2014, the Chinese Patent Application being incorporated herein by reference in its entirety.

BACKGROUND OF THE INVENTION

The present invention is related to a flash memory device and a method for manufacturing the flash memory device.

A non-volatile memory device may be implemented using split-gate flash technology. In performing a programming operation on a split-gate flash memory device, a high positive bias may be applied to the control gate (CG), such that hot electrons may be injected from the source through an oxide layer into the floating gate (FG). In performing an erasing operation on a split-gate flash memory device, a high negative bias may be applied to the control gate, such that hot electrons in the floating gate may take advantage of Fowler-Nordheim tunneling to travel through a sidewall oxide layer into the erase gate (EG). Because of Fowler-Nordheim tunneling effect, for a split-gate flash memory device, an erasing operation may require substantially longer time than a programming operation. The efficiency of erasing operations of a split-gate flash memory device may be unsatisfactory.

SUMMARY

An embodiment of the present invention may be related to a method for manufacturing a memory device. The method may include obtaining a silicon substrate structure. The silicon substrate structure may include a substrate, a floating gate oxide material layer positioned on the substrate, a floating gate polysilicon material layer positioned on the floating gate oxide material layer, a first control gate and a second control gate that are positioned on the floating gate polysilicon material layer, a first control gate sidewall layer and a second control gate sidewall layer that are respectively positioned on two opposite sides of the first control gate, and a control gate offset oxide layer that is positioned on the first control gate sidewall layer and positioned between the first control gate sidewall layer and the second control gate. The method may further include removing (e.g., through etching), using the control gate offset oxide layer as a first mask, a portion of the floating gate polysilicon material layer for forming a floating gate polysilicon structure that includes a first step structure. The method may further include forming a masking oxide layer on the control gate offset oxide layer; as a result, the masking oxide layer may be positioned between the control gate offset oxide layer and the second control gate. The method may further include removing (e.g., through etching), using the masking oxide layer as a second mask, a portion of the floating gate polysilicon structure for forming a floating gate polysilicon member that includes the first step structure and a second step structure. The method may further include providing a first polysilicon material set between the first control gate and the second control gate for forming an erase gate.

The method may include the following steps: removing the masking oxide layer and the control gate offset oxide layer; and forming an erase gate tunneling oxide layer between the first control gate sidewall layer and the second control gate.

The erase gate tunneling oxide layer may directly contact the first control gate sidewall layer and may directly contact at least one of the first step structure and the second step structure. The erase gate tunneling oxide layer may be positioned between the first control gate sidewall layer and the first polysilicon material set after the first polysilicon material set has been provided.

The may include the following step: forming a floating gate sidewall layer on the second control gate sidewall layer when the erase gate tunneling oxide layer is formed. A side surface of the floating gate polysilicon member may be positioned between the floating gate sidewall layer and at least one of the first step structure and the second step structure.

The method may include the following step: providing a second polysilicon material set for forming a word line when the first polysilicon material set is provided. The floating gate sidewall layer may be positioned between the side surface of the floating gate polysilicon member and the second polysilicon material set.

The method may include the following steps: removing (e.g., through etching), using the masking oxide layer as the second mask, a portion of the floating gate oxide material layer to expose a portion of the substrate; and forming a silicon oxide layer on the portion of the substrate. The silicon oxide layer may be positioned between the substrate and the first polysilicon material set after the first polysilicon material set has been provided.

The method may include the following steps: forming an unwanted oxide layer on the second control gate sidewall layer when the masking oxide layer is formed; covering the masking oxide layer; and removing the unwanted oxide layer when the masking oxide layer is covered.

The first polysilicon material set may directly contact a portion of the floating gate oxide material layer.

The method may include the following steps: determining a dimension requirement of the first step structure based on at least one performance requirement of the memory device; and configuring a thickness of the control gate offset oxide layer based on the dimension requirement of the first step structure.

The method may include the following steps: determining a dimension requirement of the second step structure based on at least one performance requirement of the memory device; and configuring a thickness of the masking oxide layer based on the dimension requirement of the second step structure.

The method may include the following steps: sequentially forming the floating gate oxide material layer, the floating gate polysilicon material layer, a gate dielectric material layer, a control gate polysilicon material layer, a control gate silicon oxide material layer, and a control gate silicon nitride material layer on the substrate; etching the control gate silicon nitride material layer, the control gate silicon oxide material layer, the control gate polysilicon material layer, and the gate dielectric material layer to form two word line regions, the first control gate and the second control gate positioned between the two word line regions, and an erase gate region positioned between the first control gate and the second control gate; forming the first control gate sidewall layer and the second control gate sidewall layer on the two opposite sides of the first control gate; forming a control gate offset oxide material layer on the first control gate sidewall layer; determining a thickness requirement of the control gate offset oxide layer based on a dimension requirement of the first step structure; and removing a portion of the control gate offset oxide material layer to form the control gate offset oxide layer according to the thickness requirement of the control gate offset oxide layer.

At least one of the erase gate tunneling oxide layers, the floating gate sidewall layer, the floating gate oxide material layer, the masking oxide layer, and the control gate offset oxide layer may be a silicon oxide layer.

The first control gate sidewall layer is may be an oxide-nitride composite layer.

The first control gate may include a gate dielectric layer and a control gate silicon oxide layer. The gate dielectric layer may be an oxide-nitride-oxide composite layer. The control gate silicon oxide layer may be a tetraethyl orthosilicate layer.

An embodiment of the present invention may be related to a memory device that may include the following elements: a substrate; a first floating gate and a second floating gate that are positioned on the substrate, wherein the first floating gate may include a first step structure and a second step structure that are positioned between the second floating gate and a side surface of the first floating gate; a first word line; a second word line; a first control gate and a second control gate that are positioned between the first word line and the second word line, wherein the first floating gate may be positioned between the first control gate and the substrate; and an erase gate positioned between the first control gate and the second control gate.

A first gap and a second gap may exist between the first floating gate and the second floating gate. The second gap may be positioned between the first gap and the substrate. The first gap may be larger than the second gap.

The first floating gate may include a floating gate polysilicon member and a floating gate oxide layer positioned between the substrate and the floating gate polysilicon member. The floating gate polysilicon member may include the first step structure and the second step structure.

The first control gate may include a gate dielectric layer, a control gate polysilicon layer, a control gate silicon oxide layer, and a control gate silicon nitride layer that are sequentially stacked on the first floating gate. The gate dielectric layer may be an oxide-nitride-oxide composite layer. The control gate silicon oxide layer may be a tetraethyl orthosilicate layer.

The memory device may include the following elements: a first control gate sidewall layer and a second control gate sidewall layer that are respectively positioned on and directly contact two opposite sides of the first control gate; and an erase gate tunneling oxide layer that is positioned between the erase gate and the first control gate sidewall layer and is positioned between the erase gate and at least one of the first step structure and the second step structure.

The memory device may include a floating gate sidewall layer that is positioned between the first word line and the second control gate sidewall layer and is positioned between the first word line and the side surface of the first floating gate.

The memory device may include the following elements: a first silicon oxide layer positioned between the first word line and the substrate; a second silicon oxide layer positioned between the second word line and the substrate; and a third silicon oxide layer positioned between the erase gate and the substrate and positioned between the first floating gate and the second floating gate.

According to embodiments of the invention, the two-step structures of the floating gates of the flash memory device may facilitate minimization of the voltage requirement for Fowler-Nordheim tunneling and/or may facilitate flows of hot electrons from the floating gates into the erase gate. Advantageously, the efficiency of erasing operations of the flash memory device may be optimized, while other performance characteristics of the flash memory device may not be substantially or negatively affected. Dimensions of the step structures of the floating gates may be configured based on performance requirements of the flash memory device, such that satisfactory performance related to other characteristics, such as characteristics related to erase state read current (IR1) and data retention, may also be provided.

The above summary is related to one or more of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "conduct" may mean "electrically conduct". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
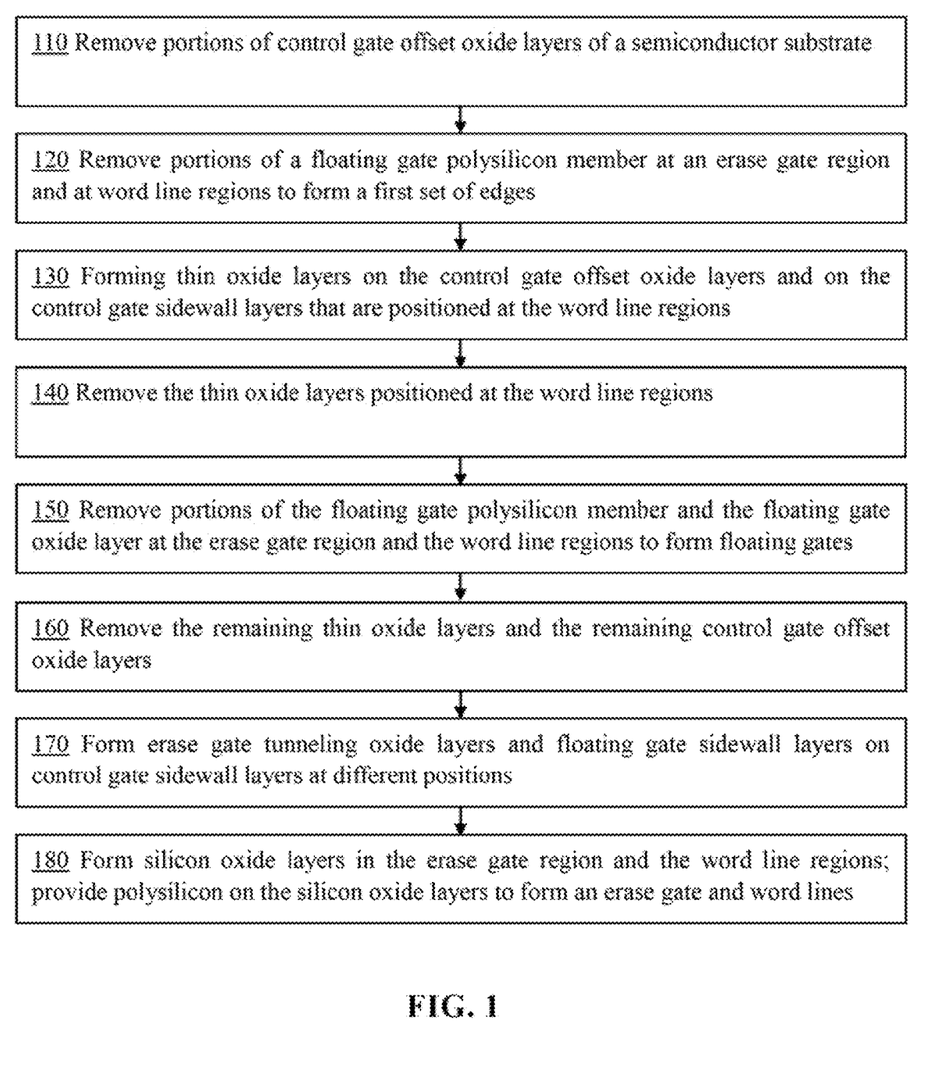
FIG. 1 shows a flowchart that illustrates a method for manufacturing a flash memory device in accordance with an embodiment of the present invention.

FIG. 1 shows a flowchart that illustrates a method for manufacturing a flash memory device in accordance with an embodiment of the present invention. Schematic cross-section views that illustrate intermediate structures related to process steps in the method are shown in FIGS. 2 to 9.

Figure 2:
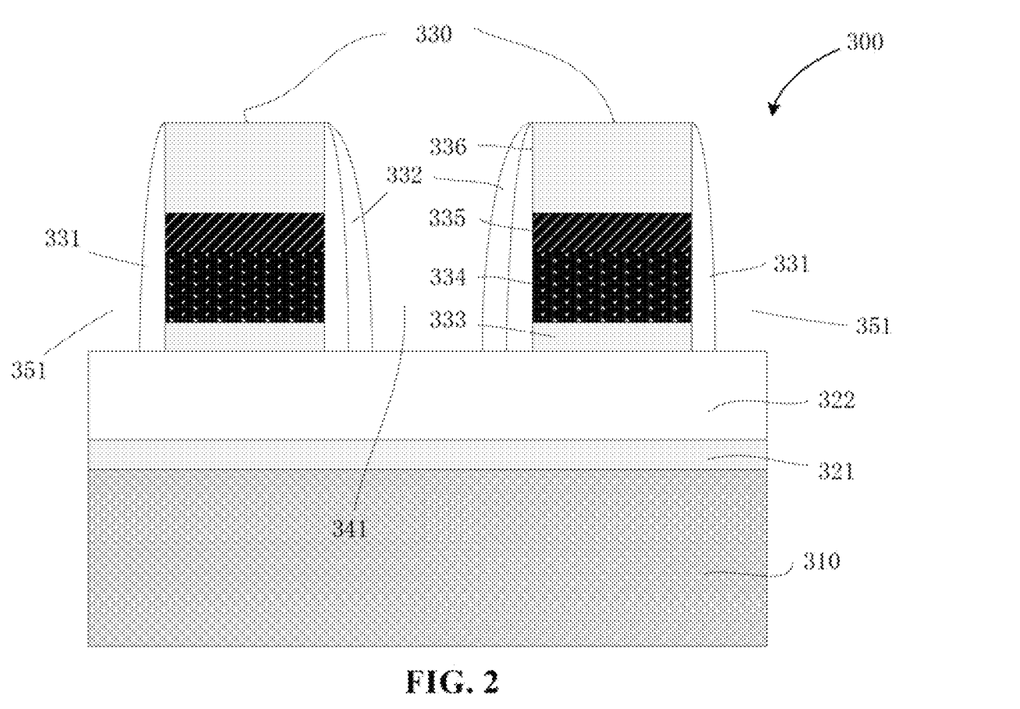
FIG. 2 shows a schematic cross-sectional view that illustrates a semiconductor substrate in accordance with an embodiment of the present invention.
Figure 3:
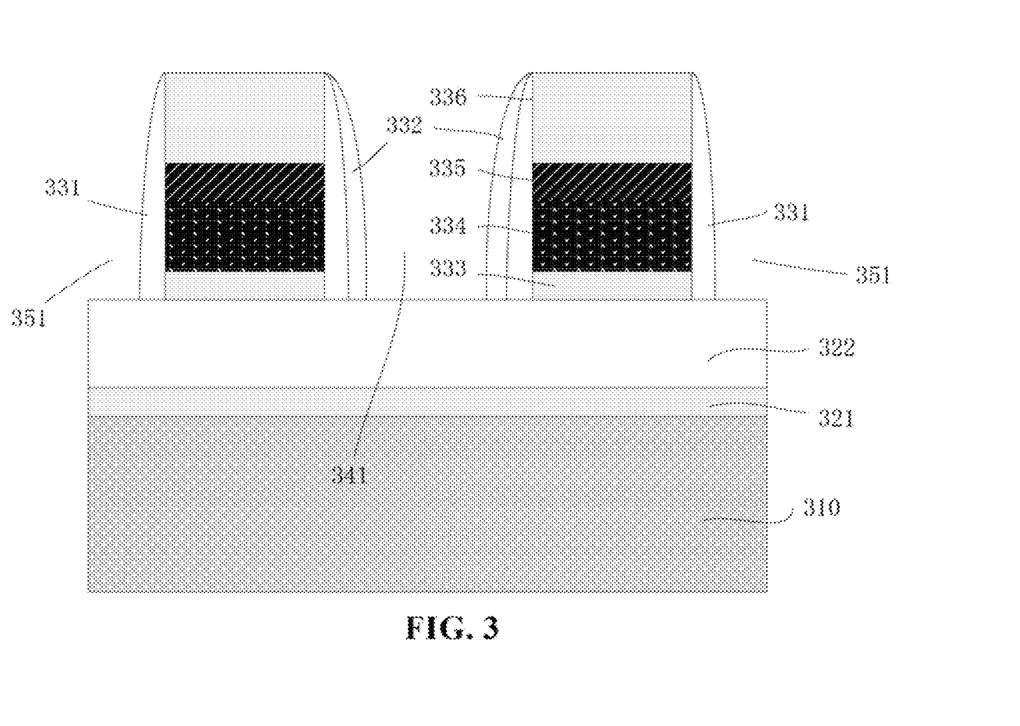
FIG. 3 shows a schematic cross-sectional view that illustrates a structure after portions of control gate offset oxide layers have been removed in accordance with an embodiment of the present invention.

FIG. 2 shows a schematic cross-sectional view that illustrates a semiconductor substrate 300 in accordance with an embodiment of the present invention. FIG. 3 shows a schematic cross-sectional view that illustrates a structure after portions of control gate offset oxide layers 332 have been removed in accordance with an embodiment of the present invention.

Referring to FIG. 2, the semiconductor substrate 300 may include a substrate 310, a floating gate oxide layer 321 positioned on the substrate 310, a floating gate polysilicon member 322 positioned on the floating gate oxide layer 321, and one or more control gate sets positioned on the floating gate polysilicon member 322. Each control gate set may have two word line regions 351, two control gates 330 positioned between the two word line regions 351, and an erase gate region 341 positioned between the two control gates 330. Each control gate 330 may be positioned between the erase gate region 341 and a word line region 351, and the erase gate region 341 and the word line region 351 may be positioned at two opposite sides of the control gate 330. Each control gate 330 may include a gate dielectric layer 333, a control gate polysilicon layer 334, a control gate silicon oxide layer 335, and a control gate silicon nitride layer 336 that are sequentially stacked on the floating gate polysilicon member 322.

Each control gate set may include two control gate sidewall layers 331 positioned at and directly contacting two opposite sides of each control gate 330. Each control gate 330 may directly contact and be positioned between two control gate sidewall layers 331. Each control gate set may include two control gate offset oxide layers 332 immediately neighboring the erase gate region 341. Each control gate offset oxide layer 332 may directly contact and be positioned on a control gate sidewall layer 331; the control gate offset oxide layer 332 may be positioned between the contacted control gate sidewall layer 331 and the erase gate region 341; the contacted control gate sidewall layer 331 may be positioned between the control gate offset oxide layer 332 and the corresponding control gate 330.

Referring to FIG. 1, FIG. 2, and FIG. 3, the method may include a step 110, removing portions of control gate offset oxide layers 332 of the semiconductor substrate 300. A portion of each control gate offset oxide layer 332 may be removed in step 110, such that each control gate offset oxide layer 332 may become thinner. Portion of the control gate offset oxide layers 332 may be removed through wet etching.

Figure 4:
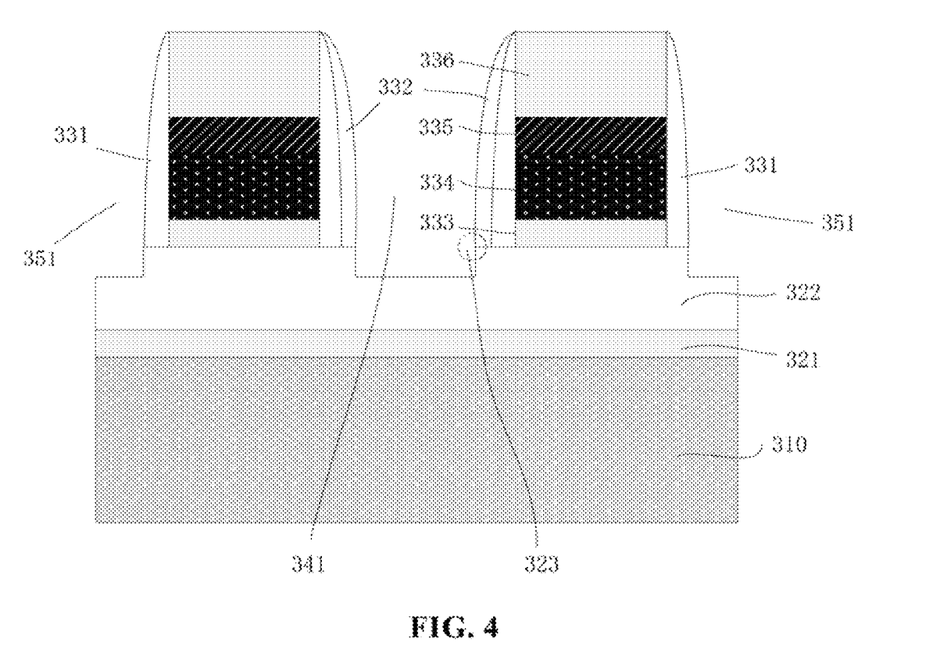
FIG. 4 shows a schematic cross-sectional view that illustrates a structure after portions of floating gate polysilicon member have been removed in accordance with an embodiment of the present invention.

FIG. 4 shows a schematic cross-sectional view that illustrates a structure after portions of the floating gate polysilicon member 322 have been removed in accordance with an embodiment of the present invention.

Referring to FIG. 1, FIG. 3, and FIG. 4, the method may include a step 120, removing a portion of the floating gate polysilicon member 322 at (and/or under) the erase gate region 341 and removing portions of the floating gate polysilicon member 322 at (and/or under) the word line regions 351. As a result, a first set of floating gate edges 323 (or floating gate tips 323) of the floating gate polysilicon member 322 may be formed. Each floating gate edge 323 may represent an edge of a first step in a two-step structure of a floating gate 320 (illustrated in FIG. 7) in accordance with an embodiment of the present invention.

In the step 120, the portions of the floating gate polysilicon member 322 may be removed through dry etching. Control gate offset oxide layers 332 (which remain after the step 110) may substantially block (or cover) portions of the floating gate polysilicon member 322 that are positioned under the control gate offset oxide layers 332 during the removal process (e.g., etching process). The blocked (or covered) portions of the floating gate polysilicon member 322 may form the floating gate edges 323. A length (or dimension) of a floating gate edge 323 (in a direction parallel to the interface between the floating gate polysilicon member 322 and the floating gate oxide layer 321) may be determined by (and/or equal to) a thickness of the corresponding control gate offset oxide layer 332. The method may include configure a thickness of a control gate offset oxide layer 332 to optimize a length of a floating gate edge 323 (and/or a length of an upper step of a floating gate 320).

Figure 5:
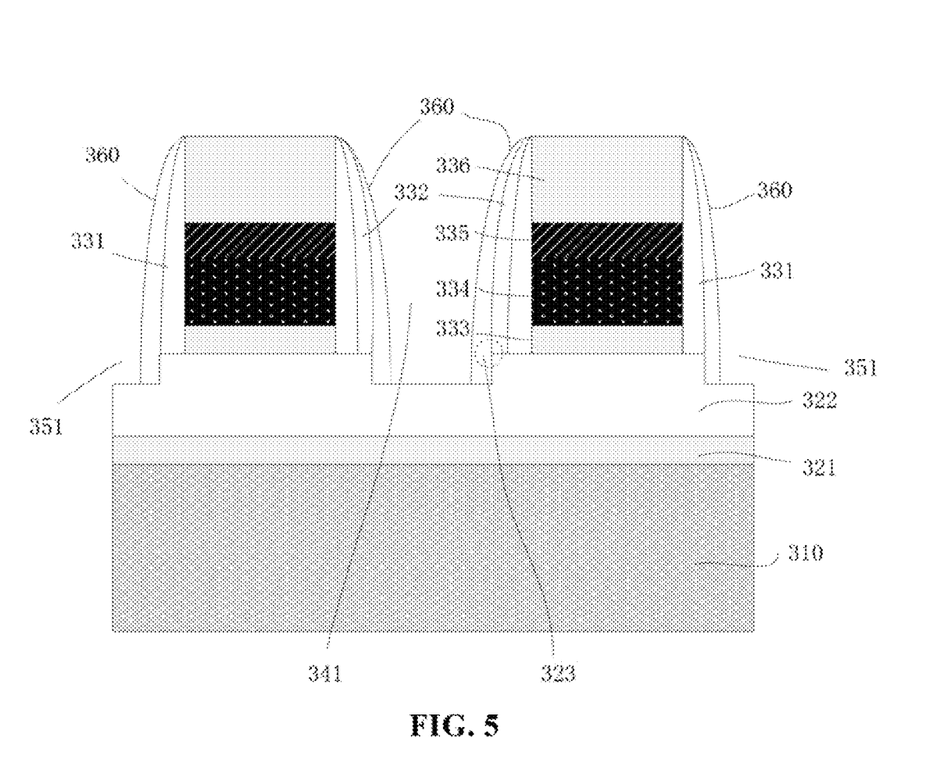
FIG. 5 shows a schematic cross-sectional view that illustrates a structure after thin oxide layers have been formed (e.g., deposited) in accordance with an embodiment of the present invention.

FIG. 5 shows a schematic cross-sectional view that illustrates a structure after thin oxide layers 360 (or masking oxide layers 360) have been formed (e.g., deposited) in accordance with an embodiment of the present invention.

Referring to FIG. 1, FIG. 4, and FIG. 5, the method may include a step 130, forming (e.g., depositing) thin oxide layers 360 (or masking oxide layers 360) on the control gate offset oxide layers 332 and forming (e.g., depositing) thin oxide layers 360 (or unwanted oxide layers 360) on the control gate sidewall layers 331 that are positioned at (and/or immediately neighbor) the word line regions 351. The thin oxide layers 360 may extend to directly contact the remaining floating gate polysilicon member 322 and may directly contact parallel sides of the floating gate edges 323. Two thin oxide layers 360 may be positioned between two floating gate edges 323 that are positioned at (and/or immediately neighbor) the erase gate region 341. A thickness of each thin oxide layer 360 may determine (and/or equal to) a length (or dimension) of a subsequently formed corresponding floating gate edge 324 (in a direction parallel to the interface between the floating gate polysilicon member 322 and the floating gate oxide layer 321). The method may include configure a thickness of a thin oxide layer 360 to optimize a length of a corresponding floating gate edge 324.

Figure 6:
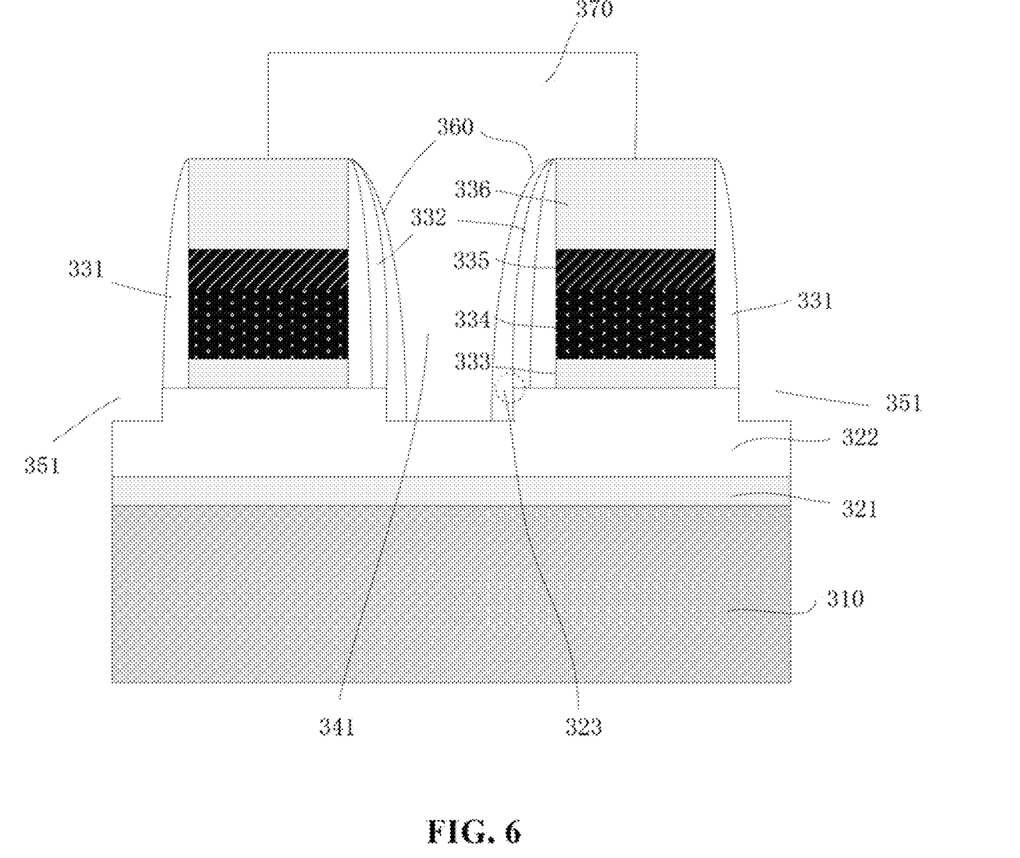
FIG. 6 shows a schematic cross-sectional view that illustrates a structure after thin oxide layer at word line region sides have been removed in accordance with an embodiment of the present invention.

FIG. 6 shows a schematic cross-sectional view that illustrates a structure after thin oxide layers 360 at word line region sides have been removed in accordance with an embodiment of the present invention.

Referring to FIG. 1, FIG. 5, and FIG. 6, the method may include a step 140, forming a mask 370 (e.g., a photoresist) to cover the erase gate region 341 and removing (e.g., through wet etching) the thin oxide layers 360 that are positioned at (and/or immediately neighbor) the word line regions 351. The removal of the thin oxide layers 360 at the word line regions 351 may prevent formation of floating gate edges at the word line regions 351, for preventing unwanted point discharge that might undesirably affect programming characteristics of the flash memory device.

Figure 7:
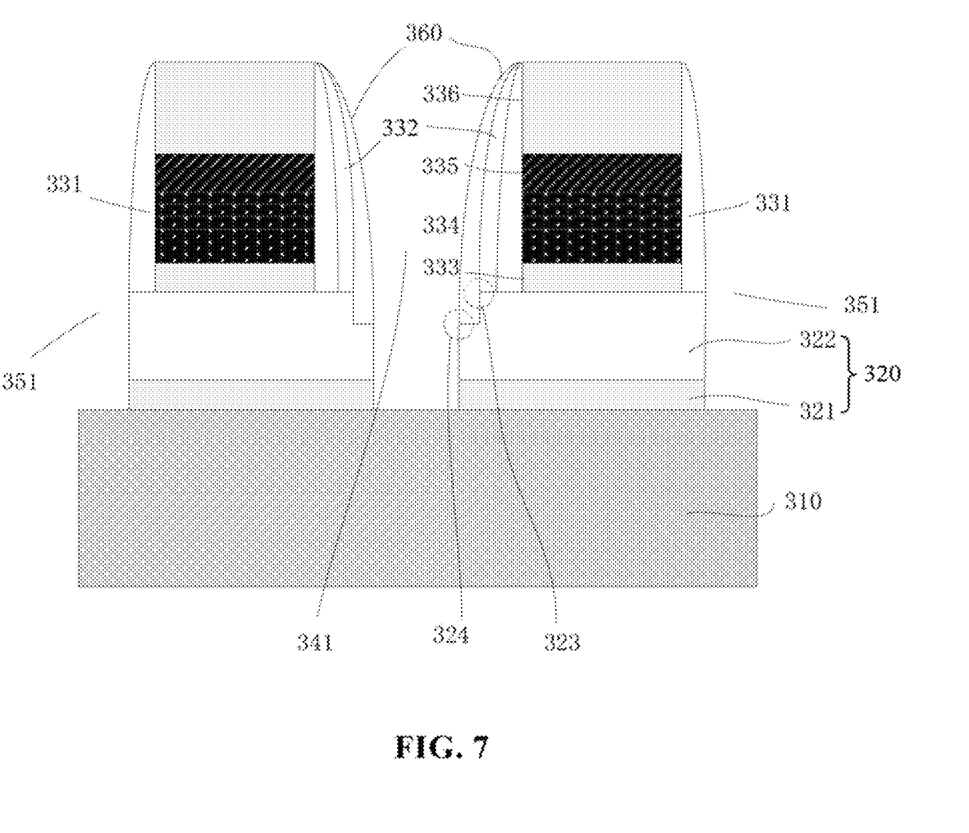
FIG. 7 shows a schematic cross-sectional view that illustrates a structure after floating gates have been formed in accordance with an embodiment of the present invention.

FIG. 7 shows a schematic cross-sectional view that illustrates a structure after floating gates 320 have been formed in accordance with an embodiment of the present invention.

Referring to FIG. 1, FIG. 6, and FIG. 7, the method may include a step 150, removing the mask 370 and removing (e.g., through etching) portions of the floating gate polysilicon member 322 and portions of the floating gate oxide layer 321 that are positioned at (or under) the erase gate region 341 and the word line regions 351. As a result, floating gates 320 may be formed. Each floating gate 320 may include a remaining portion of the floating gate polysilicon member 322 and a remaining portion of the floating gate oxide layer 321. Each floating gate 320 may have a two-step structure that includes a floating gate edge 323 at an upper step and includes a floating gate edge 324 at a lower step.

In the step 150, the portions of the floating gate polysilicon member 322 and the portions of the floating gate oxide layer 321 that are positioned at the erase gate region 341 and the word line regions 351 may be removed through dry etching. In the removal process (e.g., etching process), the thin oxide layers 360 may substantially block (or cover) portions of the floating gate polysilicon member 322 that are positioned under the thin oxide layers 360. The blocked (or covered) portions of the floating gate polysilicon member 322 may form the floating gate edges 324. A length (or dimension) of a floating gate edge 324 (in a direction parallel to the interface between the floating gate polysilicon member 322 and the floating gate oxide layer 321) may be determined by (and/or equal to) a thickness of the corresponding thin oxide layer 360. The method may include configure a thickness of a thin oxide layer 360 to optimize a length of a floating gate edge 324 (and/or a length of a lower step of a floating gate 320).

Figure 8:
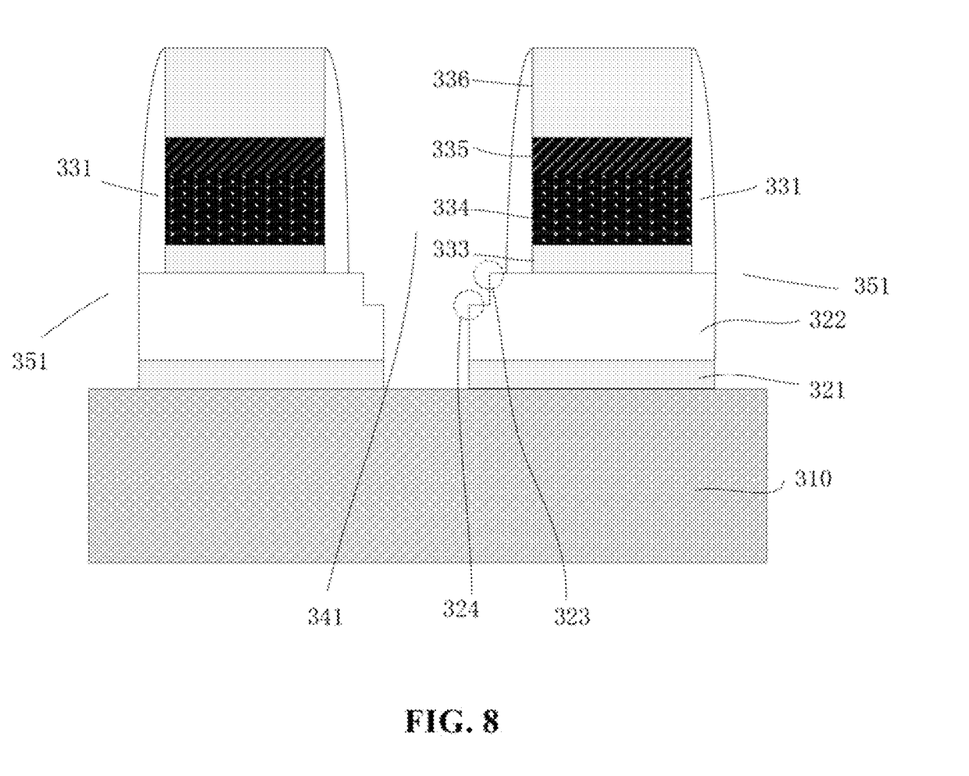
FIG. 8 shows a schematic cross-sectional view that illustrates a structure after the remaining thin oxide layers (at an erase gate region) and the remaining control gate offset oxide layers have been removed in accordance with an embodiment of the present invention.

FIG. 8 shows a schematic cross-sectional view that illustrates a structure after the remaining thin oxide layers 360 (at the erase gate region 341) and the remaining control gate offset oxide layers 332 have been removed in accordance with an embodiment of the present invention.

Referring to FIG. 1, FIG. 7, and FIG. 8, the method may include a step 160, removing (e.g., though etching) the remaining thin oxide layers 360 (at the erase gate region 341) and the remaining control gate offset oxide layers 332. As a result, the floating gate edges 323 and 324 may be exposed.

Figure 9:
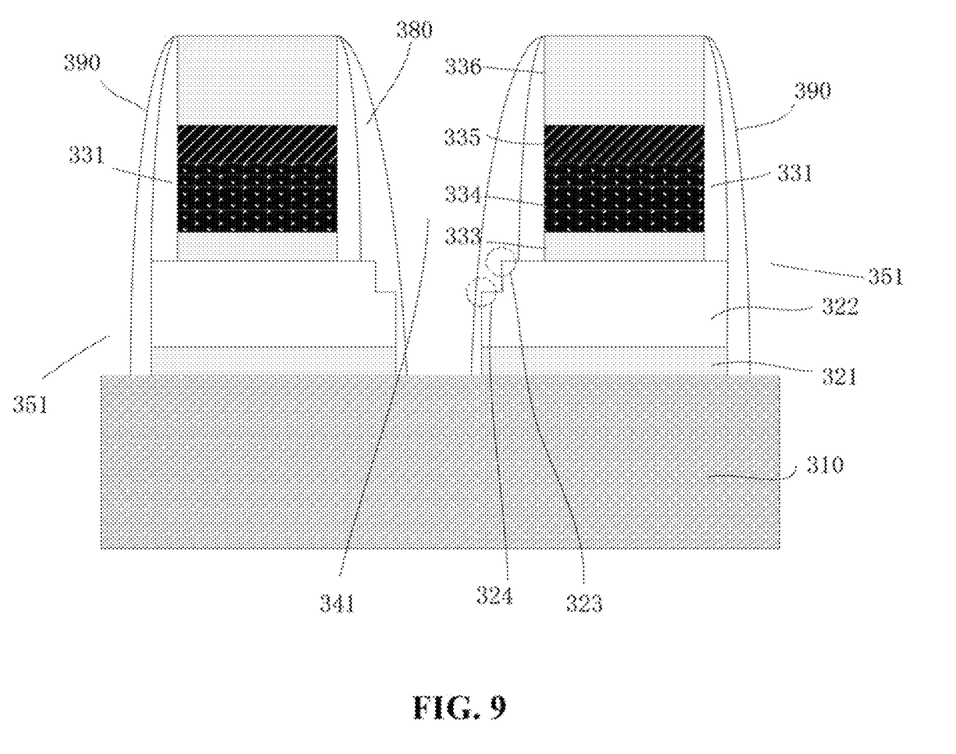
FIG. 9 shows a schematic cross-sectional view that illustrates a structure after erase gate tunneling oxide layers and floating gate sidewall layers have been formed in accordance with an embodiment of the present invention.

FIG. 9 shows a schematic cross-sectional view that illustrates a structure after erase gate tunneling oxide layers 380 and floating gate sidewall layers 390 have been formed in accordance with an embodiment of the present invention.

Referring to FIG. 1, FIG. 8, and FIG. 9, the method may include a step 170, forming (e.g., through deposition) erase gate tunneling oxide layers 380 and floating gate sidewall layers 390 on the control gate sidewall layers 331. The erase gate tunneling oxide layers 380 may be formed on (and directly contact) the control gate sidewall layers 331 that are positioned at (and/or immediately neighbor) the erase gate region 341. The floating gate sidewall layers 390 may be formed on (and directly contact) the control gate sidewall layers 331 that are positioned at (and/or immediately neighbor) the word line regions 351. Two control gate sidewall layers 331, a control gate 330, and a floating gate 320 may be positioned between an erase gate tunneling oxide layer 380 and a floating gate sidewall layer 390.

Figure 10:
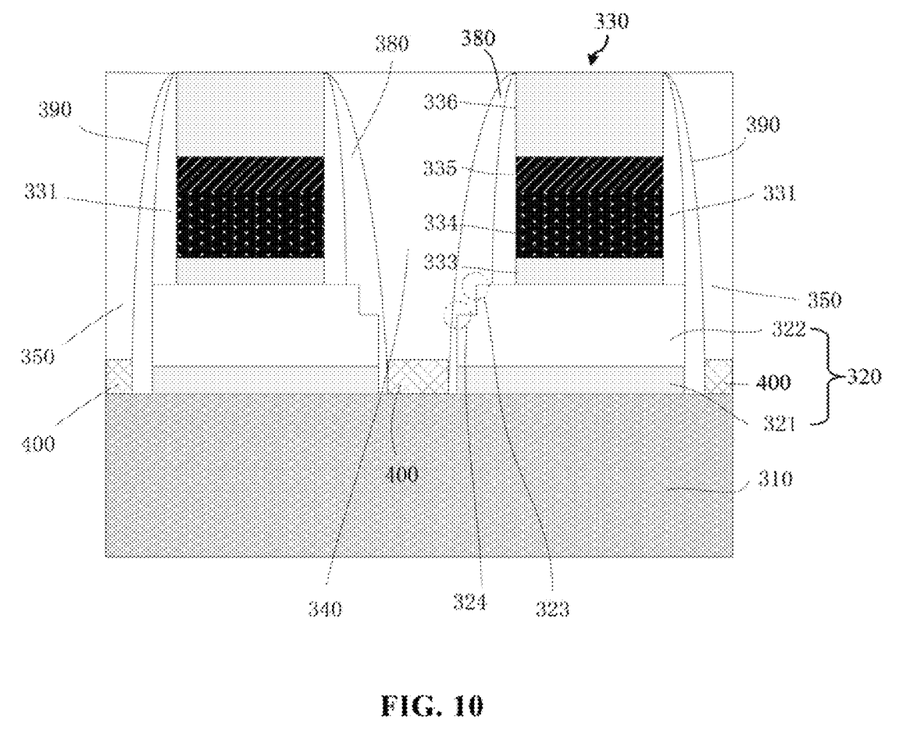
FIG. 10 shows a schematic cross-sectional view that illustrates a flash memory device in accordance with an embodiment of the present invention.

FIG. 10 shows a schematic cross-sectional view that illustrates a flash memory device in accordance with an embodiment of the present invention.

Referring to FIG. 1, FIG. 9, and FIG. 10, the method may include a step 180, which may include forming (e.g., through deposition) silicon oxide layers 400 at the bottom of the erase gate region 341 and at the bottoms of the word line regions 351. A furnace technology may be utilized in the deposition of the silicon oxide layers 400. The silicon oxide layers 400 may directly contact the substrate 310. The step 180 may further include subsequently providing (e.g., through deposition) a polysilicon material on the silicon oxide layer 400 in each erase gate region 341 and on the silicon oxide layers 400 in the word line regions 351. The polysilicon material may be deposited through, one or more deposition processes, such as plasma enhanced chemical vapor deposition (PECVD). As a result, an erase gate 340 may be formed between (and directly contact) two erase gate tunneling oxide layers 380 and may be formed on (and directly contact) the silicon oxide layer 400 in each erase gate region 341, and word lines 350 may be respectively formed on (and directly contact) silicon oxide layers 400 in the word line regions 351, such that a flash memory device may be formed.

Using the method illustrated in FIG. 1, the flash memory device illustrated in FIG. 10 may be manufactured, wherein each floating gate 320 of the flash device may include a two-step structure that may have two floating gate edges (or tips) 324 and 324. The two-step structure may facilitate minimization of the voltage requirement for Fowler-Nordheim tunneling and/or may facilitate flows of hot electrons from the floating gate 320 into the erase gate 340. Advantageously, the efficiency of erasing operations of the flash memory device may be optimized, while other performance characteristics of the flash memory device may not be substantially or negatively affected.

The method may include predetermining one or more dimensions, such as one or more of a length (e.g., width) of a floating gate 320, a difference between a length (e.g., width) of a floating gate 320 and the corresponding length (e.g., width) of the corresponding control gate 330, one or more protrusions of a floating gate 320 beyond the corresponding control gate 330, an amount of a portion of the floating gate polysilicon member 322 to be removed, etc., based on one or more performance requirements of the flash memory device. The performance requirements may include one or more of the erase state current (IR1), data retention, etc. The method may further include determining the thicknesses (and/or removal amounts) of the control gate offset oxide layer 332 and/or determining the thicknesses of the thin oxide layer 360 based on the one or more predetermined dimensions.

Some of the floating gate oxide layer 321, the thin oxide layers 360, the control gate offset oxide layers 332, the floating gate sidewall layers 390, etc. may be formed of one or more identical or analogous materials.

One or more of the floating gate oxide layer 321, the thin oxide layers 360, the control gate offset oxide layers 332, the floating gate sidewall layers 390, etc. may be formed of a silicon oxide material, e.g., $SiO_2$.

The erase gate tunneling oxide layers 380 may be formed of a silicon oxide material, e.g., $SiO_2$.

The control gate sidewall layers 331 may be composite layers that may include an oxide material and a nitride material. For example, a control gate sidewall layer 331 may include an oxide inner layer that directly contacts the corresponding control gate 330 and may include an outer silicon nitride (SiN) layer that directly contacts the corresponding erase gate tunneling oxide layers 380 or floating gate sidewall layer 390.

In an embodiment, the floating gate oxide layer 321 may be a silicon oxide layer. In the step 150, the floating gate oxide layer 321 may not be etched, or only a partial thickness of the floating gate oxide layer 321 may be etched, such that the floating gate oxide layer 321 may be completely or substantially retained. In step 180, the silicon oxide layers 400 may not be formed or may be formed with a substantially small thickness.

In an embodiment, the floating gate oxide layer 321 may not be substantially etched, and no silicon oxide layers 400 may be formed. In step 180, a polysilicon material may be provided on the floating gate oxide layer 321 in each erase gate region 341 and in the word line regions 351. As a result, an erase gate 340 may be formed between (and directly contact) two erase gate tunneling oxide layers 380 and may be formed on (and directly contact) the floating gate oxide layer 321 in each erase gate region 341, and word lines 350 may be formed on (and directly contact) the floating gate oxide layer 321 in the word line regions 351

Figure 11:
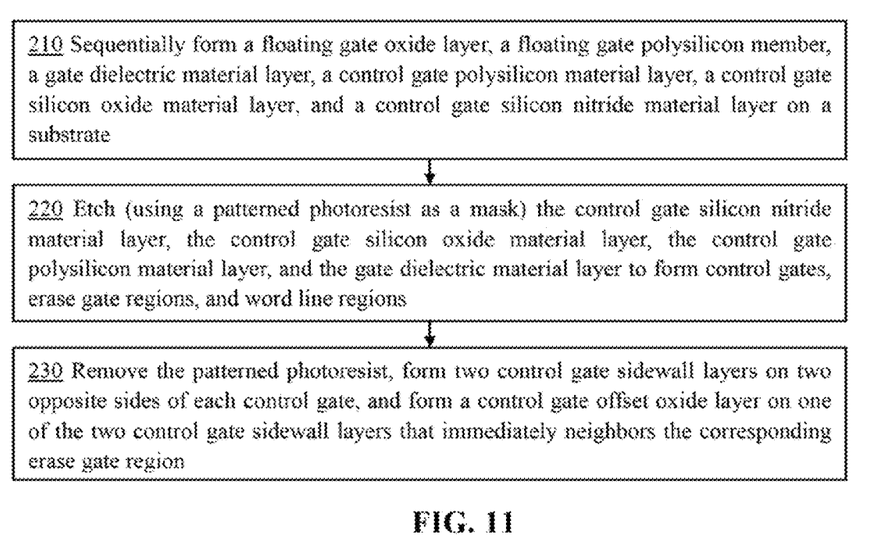
FIG. 11 shows a flowchart that illustrates a method for forming a semiconductor substrate in accordance with an embodiment of the present invention.

FIG. 11 shows a flowchart that illustrates a method for forming the semiconductor substrate 300 in accordance with an embodiment of the present invention. The method for forming the semiconductor substrate 300 may be performed prior to the step 110 discussed with reference to FIG. 1, FIG. 2, and FIG. 3.

The method may include a step 210, sequentially forming a floating gate oxide layer 321, a floating gate polysilicon member 322, a gate dielectric material layer (for forming gate dielectric layers 333), a control gate polysilicon material layer (for forming control gate polysilicon layers 334), a control gate silicon oxide material layer (for forming control gate silicon oxide layers 335), and a control gate silicon nitride material layer (for forming control gate silicon nitride layers 336) on a substrate 310 through one or more deposition processes, such as metal-organic chemical vapor deposition (MOCVD).

The substrate 310 may be or may include one or more of a silicon substrate, a silicon-on-insulator substrate, etc. The floating gate oxide layer 321 may be a silicon oxide layer. The gate dielectric material layer (for forming gate dielectric layers 333) may be a composite layer, e.g., an oxide-nitride-oxide (ONO) composite layer. The control gate silicon oxide material layer (for forming control gate silicon oxide layers 335) may be a tetraethyl orthosilicate (TEOS) layer.

The method may further include a step 220, providing a patterned photoresist on the control gate silicon nitride material layer and etching, using the patterned photoresist as a mask, the control gate silicon nitride material layer (for forming control gate silicon nitride layers 336), the control gate silicon oxide material layer (for forming control gate silicon oxide layers 335), the control gate polysilicon material layer (for forming control gate polysilicon layers 334), and the gate dielectric material layer (for forming gate dielectric layers 333). Therefore, the floating gate polysilicon member 322 may be exposed, and control gates 330, one or more erase gate regions 341, and word line regions 351 may be formed.

The method may further include a step 230, removing the patterned photoresist, forming two control gate sidewall layers 331 on two opposite sides of each control gate 330, and forming a control gate offset oxide layer 332 on a first control gate sidewall layer 331 of the two control gate sidewall layers 331 that immediately neighbors the corresponding erase gate region 341, such that the control gate offset oxide layer 332 is positioned between the erase gate region 341 and the first control gate sidewall layer 331.

Remove the patterned photoresist, form two control gate sidewall layers on two opposite sides of each control gate, and form a control gate offset oxide layer on one of the two control gate sidewall layers that immediately neighbors the corresponding erase gate region.

An embodiment of the invention may be related to a flash memory device that may be manufactured using one or more steps discussed above. Referring to FIG. 10, the flash memory device may include a substrate 310.

The flash memory device may further include a first floating gate 320 and a second floating gate positioned on the substrate 310. The first floating gate 320 may include a first step structure and a second step structure, the first step structure having a floating gate edge (or tip) 323, the second step structure having a floating gate edge (or tip) 324. The first step structure and the second structure are positioned between the second floating gate and a side surface of the first floating gate 320.

A first gap (or first horizontal distance) between the floating gate edge 323 (or the first step structure) and the second floating gate may be parallel to and larger than a second gap (or second horizontal distance) between the floating gate edge 324 (or the second step structure) and the second floating gate. The second gap may be positioned between the first gap and the substrate 310.

The first floating gate 320 may include a floating gate polysilicon member 322 and a floating gate oxide layer 321 positioned between the substrate 310 and the floating gate polysilicon member 322. The floating gate polysilicon member 322 may include the first step structure and the second step structure.

The flash memory device may include a first control gate 330, a second control gate, a first word line 350, a second word line 350, and an erase gate 340. The erase gate 340 may be positioned between the first control gate 330 and the second control gate. The first control gate 330 and the second control gate may be positioned between the first word line 350 and the second word line 350. The floating gate polysilicon 322 may be positioned between the floating gate oxide layer 321 and the first control gate 330. The first control gate 330 may include a gate dielectric layer 333, a control gate polysilicon layer 334, a control gate silicon oxide layer 335, and a control gate silicon nitride layer 336 that are sequentially stacked on the floating gate polysilicon member 322. The gate dielectric layer 333 may be an ONO composite layer. The control gate silicon oxide layer 335 may be made of TEOS.

The flash memory device may include a first control gate sidewall layer 331 and a second control gate sidewall layer that are respectively positioned on and directly contact two opposite sides of the first control gate 330. The first control gate 330 may be positioned between the first control gate sidewall layer 331 and the second control gate sidewall layer. Each of the first control gate sidewall layer 331 and the second control gate sidewall layer may be an oxide-nitride composite layer.

The flash memory device may include an erase gate tunneling oxide layer 380 that is positioned on and directly contacts the first control gate sidewall layer 331 and the step structures of the first floating gate 320. The erase gate tunneling oxide layer 380 may be positioned between the erase gate 340 and the first control gate sidewall layer 331. The erase gate tunneling oxide layer 380 may be positioned between the erase gate 340 and the step structures of the first floating gate 320.

The flash memory device may include a floating gate sidewall layer 390 that is positioned on and directly contacts the second control gate sidewall layer 331 and the aforementioned side surface of the first floating gate 320. The floating gate sidewall layer 390 may be positioned between the first word line 350 and the second control gate sidewall layer 331. The floating gate sidewall layer 390 may be positioned between the first word line 350 and the side surface of the first floating gate 320. The floating gate sidewall layer 390 may be a silicon oxide layer.

The flash memory device may include a first silicon oxide layer 400, a second silicon oxide layer 400, and a third silicon oxide layer 400. The first silicon oxide layer 400 may be positioned between the first word line 350 and the substrate 310. The second silicon oxide layer 400 may be positioned between the second word line 350 and the substrate 310. The third silicon oxide layer 400 may be positioned between the erase gate 340 and the substrate 310. The third silicon oxide layer 400 may be positioned between (the floating gate oxide layer 321 of) the first floating gate 320 and (a floating gate oxide layer of) the second floating gate.

According to embodiments of the invention, the two-step structures of the floating gates of the flash memory device may facilitate minimization of the voltage requirement for Fowler-Nordheim tunneling and/or may facilitate flows of hot electrons from the floating gate 320 into the erase gate 340. Advantageously, the efficiency of erasing operations of the flash memory device may be optimized, while other performance characteristics of the flash memory device may not be substantially or negatively affected. Dimensions of the step structures of the first floating gate 320 and the second floating gate may be configured based on performance requirements of the flash memory device.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a memory device, the method comprising:

obtaining a silicon substrate structure, wherein the silicon substrate structure includes a substrate, a floating gate oxide material layer positioned on the substrate, a floating gate polysilicon material layer positioned on the floating gate oxide material layer, a first control gate and a second control gate that are positioned on the floating gate polysilicon material layer, a first control gate sidewall layer and a second control gate sidewall layer that are respectively positioned on two opposite sides of the first control gate, and a control gate offset oxide layer that is positioned on the first control gate sidewall layer and positioned between the first control gate sidewall layer and the second control gate;

removing, using the control gate offset oxide layer as a first mask, a portion of the floating gate polysilicon material layer for forming a floating gate polysilicon structure that includes a first step structure;

forming a masking oxide layer on the control gate offset oxide layer, such that the masking oxide layer is positioned between the control gate offset oxide layer and the second control gate;

removing, using the masking oxide layer as a second mask, a portion of the floating gate polysilicon structure for forming a floating gate polysilicon member that includes the first step structure and a second step structure; and providing a first polysilicon material set between the first control gate and the second control gate for forming an erase gate.

2. The method of claim 1, further comprising:
removing the masking oxide layer and the control gate offset oxide layer; and
forming an erase gate tunneling oxide layer between the first control gate sidewall layer and the second control gate,
wherein the erase gate tunneling oxide layer directly contacts the first control gate sidewall layer and directly contacts at least one of the first step structure and the second step structure, and
wherein the erase gate tunneling oxide layer is positioned between the first control gate sidewall layer and the first polysilicon material set after the first polysilicon material set has been provided.

3. The method of claim 2, further comprising:
forming a floating gate sidewall layer on the second control gate sidewall layer when the erase gate tunneling oxide layer is formed,
wherein a side surface of the floating gate polysilicon member is positioned between the floating gate sidewall layer and at least one of the first step structure and the second step structure.

4. The method of claim 3, further comprising:
providing a second polysilicon material set for forming a word line when the first polysilicon material set is provided,
wherein the floating gate sidewall layer is positioned between the side surface of the floating gate polysilicon member and the second polysilicon material set.

5. The method of claim 1, further comprising:
removing, using the masking oxide layer as the second mask, a portion of the floating gate oxide material layer to expose a portion of the substrate; and
forming a silicon oxide layer on the portion of the substrate,
wherein the silicon oxide layer is positioned between the substrate and the first polysilicon material set after the first polysilicon material set has been provided.

6. The method of claim 1, further comprising:
forming an unwanted oxide layer on the second control gate sidewall layer when the masking oxide layer is formed;
covering the masking oxide layer; and
removing the unwanted oxide layer when the masking oxide layer is covered.

7. The method of claim 1, wherein the first polysilicon material set directly contacts a portion of the floating gate oxide material layer.

8. The method of claim 1, further comprising:
determining a dimension requirement of the first step structure based on at least one performance requirement of the memory device; and
configuring a thickness of the control gate offset oxide layer based on the dimension requirement of the first step structure.

9. The method of claim 1, further comprising:
determining a dimension requirement of the second step structure based on at least one performance requirement of the memory device; and
configuring a thickness of the masking oxide layer based on the dimension requirement of the second step structure.

10. The method of claim 1, further comprising:
sequentially forming the floating gate oxide material layer, the floating gate polysilicon material layer, a gate dielectric material layer, a control gate polysilicon material layer, a control gate silicon oxide material layer, and a control gate silicon nitride material layer on the substrate;
etching the control gate silicon nitride material layer, the control gate silicon oxide material layer, the control gate polysilicon material layer, and the gate dielectric material layer to form two word line regions, the first control gate and the second control gate positioned between the two word line regions, and an erase gate region positioned between the first control gate and the second control gate;
forming the first control gate sidewall layer and the second control gate sidewall layer on the two opposite sides of the first control gate;
forming a control gate offset oxide material layer on the first control gate sidewall layer;
determining a thickness requirement of the control gate offset oxide layer based on a dimension requirement of the first step structure; and
removing a portion of the control gate offset oxide material layer to form the control gate offset oxide layer according to the thickness requirement of the control gate offset oxide layer.

11. The method of claim 1, wherein at least one of the floating gate oxide material layer, the masking oxide layer, and the control gate offset oxide layer is a silicon oxide layer.

12. The method of claim 1, wherein the first control gate sidewall layer is an oxide-nitride composite layer.

13. The method of claim 1,
wherein the first control gate includes a gate dielectric layer and a control gate silicon oxide layer,
wherein the gate dielectric layer is an oxide-nitride-oxide composite layer, and
wherein the control gate silicon oxide layer is a tetraethyl orthosilicate layer.

* * * * *